US00RE34107E

United States Patent [19]

Wirth

[11] E Patent Number: Re. 34,107

[45] Reissued Date of Patent: Oct. 20, 1992

[54] POWER TRANSISTOR DRIVE CIRCUIT WITH IMPROVED SHORT CIRCUIT PROTECTION

[75] Inventor: William F. Wirth, Sullivan, Wis.

[73] Assignee: General Electric Company, Milwaukee, Wis.

[21] Appl. No.: 648,452

[22] Filed: Jan. 30, 1991

Related U.S. Patent Documents

Reissue of:

[64] Patent No.: 4,954,917
Issued: Sep. 4, 1990
Appl. No.: 336,931
Filed: Apr. 12, 1989

[51] Int. Cl.[5] ..... H02H 9/04

[52] U.S. Cl. ..... 361/18; 361/42; 361/58; 361/86; 323/276; 323/908

[58] Field of Search ..... 361/42, 58, 88, 91, 361/18, 89, 86, 111, 56; 363/55, 56, 908; 323/281, 274, 276

[56] References Cited

U.S. PATENT DOCUMENTS 4,306,270 12/1981 Miller et al. ..... 361/90
4,423,457 12/1983 Brajder ..... 361/86
4,719,531 1/1988 Okado et al. ..... 361/86
4,721,869 1/1988 Okado ..... 361/101

OTHER PUBLICATIONS

Conference Record of the 1988 IEEE Industry Application Society Annual Meeting, Part I, *Short-Circuit Capability of IGBT (Comfet) Transistors*, IEE Catalog Number 88CH2565-0, pp. 615-619.

PCIM, *IGBT Power Modules Pieride Effective Inverter Performance*, Jan. 1989, pp. 76-81.

*Primary Examiner*—Todd E. DeBoer
*Attorney, Agent, or Firm*—Quarles & Brady

[57] ABSTRACT

A gate drive circuit for an insulated gate bipolar transistor initially drives the gate to a first voltage potential which causes the transistor to partially turn on. A sensor detects when the transistor saturates at which point the gate drive voltage is increased to increase the conductivity of the transistor and reduce its saturation voltage drop. If, however, a load coupled to the transistor is short circuited, the transistor will never reach saturation and will remain partially turned on at a point where it has increased short circuit current handling capability. In addition, once the transistor has been fully turned on, should a short circuit load condition occur, the transistor will drop out of saturation causing the drive circuit to reduce the gate voltage to increase the short circuit current handling capability of the transistor.

14 Claims, 1 Drawing Sheet

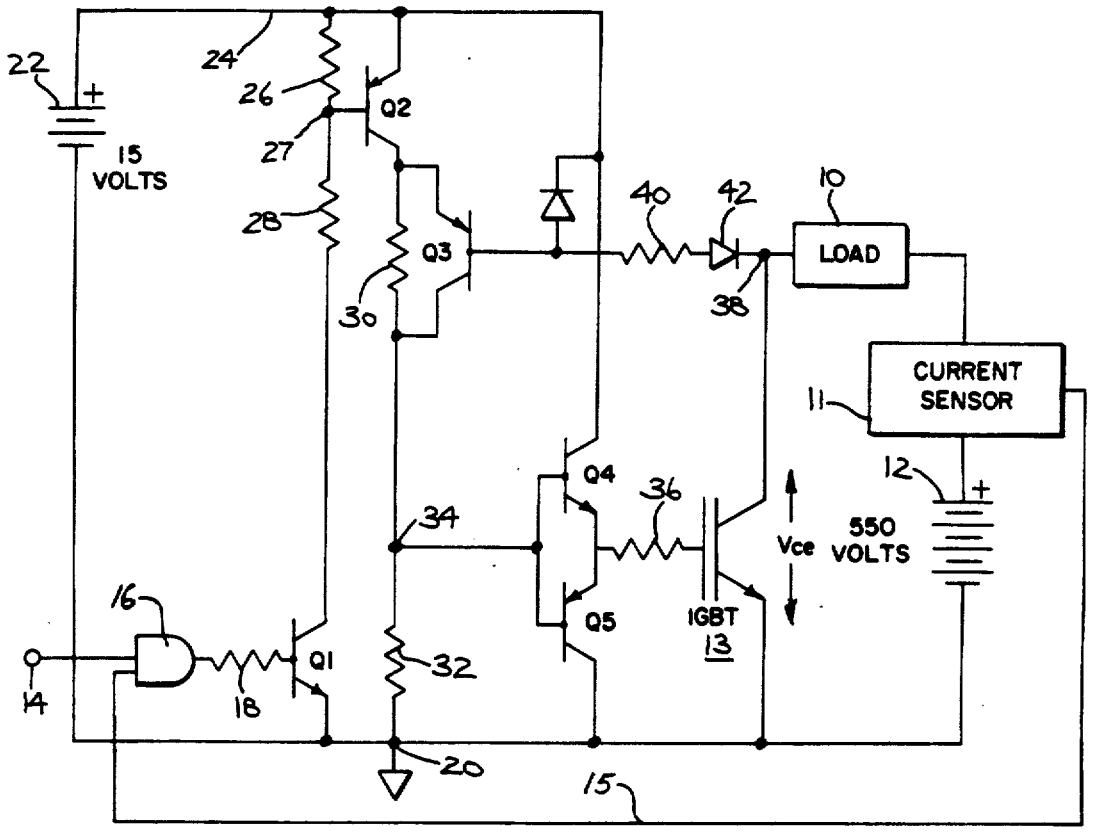
22
+
15
VOLTS
24
26
27
28
Q2
Q3
30
40
42
10
LOAD
38
CURRENT
SENSOR
11
12
+
550
VOLTS
Q4
36
34
Vce
Q5
IGBT
13
16
Q1
32
14
18
20
15

POWER TRANSISTOR DRIVE CIRCUIT WITH IMPROVED SHORT CIRCUIT PROTECTION

Matter enclosed in heavy brackets [ ] appears in the original patent but forms no part of this reissue specification; matter printed in italics indicates the additions made by reissue.

BACKGROUND OF THE INVENTION

The present invention relates to circuits for driving power transistors which control the application of electricity to a load; and more particularly to such circuits which provide some degree of protection against the adverse effects of a short circuit in the load coupled to the transistor.

A recent addition to the family of power semiconductor devices are insulated gate bipolar transistors (IGBT). This type of device is adapted for use in power supplies and other applications where it is required to switch currents on the order of several hundred amperes. One application of IGBT's is in high frequency inverters of X-ray generators.

A desirable feature of this type of power semiconductor device, compared to thyristors, is the capability of surviving short circuit load conditions by self-limiting the fault current rather than relying solely upon conventional protection techniques. This self-limiting capability is a function of the conductivity of the IGBT and the magnitude of the drive voltage applied to its gate electrode. Higher gat voltages permit a greater fault current to flow through the transistor; thereby increasing the stress on the device and likelihood that it will fail under a short circuit condition before a current sensor can act to turn off the transistor's gate drive. It is therefore advantageous from the aspect of short circuit survival to limit the conductivity of the transistor, but this has the adverse effect of raising the on-state voltage drop across the IGBT. A higher voltage drop results in a larger power loss in the device and more power dissipation. When the IGBT is switching several hundred amperes, a difference of a few volts across the device amounts to a significant power dissipation.

As a consequence, a designer seeking to incorporate an IGBT into a power switching circuit has been faced with the dilemma of choosing between a relatively high gate drive voltage in order to reduce the power dissipation in the device, while reducing short circuit protection; or utilizing a lower gate drive voltage to increase the short circuit survivability, while increasing the power dissipation of the device.

SUMMARY OF THE INVENTION

The present apparatus drives the gate of a IGBT power semiconductor in a manner which utilizes the short circuit protection capabilities of the device under fault conditions, while reducing the power loss in the device under normal operating load conditions. To accomplish this end, the circuit detects when the IGBT is in a state of saturation by sensing the voltage across the collector and emitter of the transistor. The present invention drives the gate of the transistor at a first voltage level when the voltage across the collector and emitter is below a predetermined threshold. When the collector-emitter voltage is above this threshold, as occurs under a short circuit load condition, the gate electrode is driven at a second voltage level. The second voltage level reduces the conductivity of the transistor from the conductivity level when the gate is driven at the first voltage level. By reducing the conductivity of the device under a short circuit condition, the transistor can tolerate the short circuit current for a longer period of time thereby enabling conventional protection circuits to operate before the transistor fails. However, under normal load conditions, the drive circuit increases the conductivity of the IGBT thereby reducing the voltage drop and power loss.

An object of the present invention is to fully turn on the power transistor under normal load conditions, but to reduce the conductivity of the transistor when a short circuit condition exists.

Another object of the present invention is to determine when a short circuit condition exists by detecting when the transistor saturates. In the preferred embodiment, this is accomplished by sensing the voltage across the collector and emitter of the transistor.

Yet another object is to increase the length of time that the IGBT can survive a short circuit current to enable conventional protection devices to act.

BRIEF DESCRIPTION OF THE DRAWING

The figure of the drawing is a schematic diagram of a circuit which incorporates an embodiment of the present invention.

DETAILED DESCRIPTION OF THE INVENTION

With reference to the drawing, a load 10 is coupled to a source of electrical power, such as a first battery 12, by an insulated gate bipolar transistor (IGBT) 13 and a conventional short circuit current sensor 11. The emitter of the IGBT 13 is connected to the negative terminal of the first battery 12 and the IGBT's collector is connected to the load a first node 38. When the IGBT 13 is turned on, the current from the first battery 12 flows through the load 10.

When the current flowing between the load 10 and the first battery 12 exceeds a given level indicative of a short circuit condition, the current sensor 11 reacts by applying a low logic level signal onto line 15. Otherwise, a high logic level signal is applied to line 15 by the current sensor 11.

In this circuit, the IGBT 13 enables a relatively low voltage control signal, on the order of ten to twenty volts, to control the application of a relatively high voltage and current to the load, for example, 100 amperes at 550 volts. Specifically, the load 10 is controlled by an input signal at terminal 14 which is coupled to one input of an AND gate 16. The other input of the AND gate is connected to line 15 from the current sensor 11. The AND gate 16 allows a digital logic level signal from an external control circuit to activate the IGBT 13. Specifically, under normal conditions, a high level voltage at terminal 14 turns on the application of electricity to the load, whereas a low level voltage applied to the terminal turns off that electricity. The output of the AND gate 16 is coupled by a current limiting resistor 18 to the base of an NPN transistor Q1. The emitter of transistor Q1 is directly coupled to circuit ground 20, which is connected to the negative terminal of a second battery 22. The second battery 22 supplies a low voltage (e.g. 15 volts) to the IGBT control circuit. The positive terminal of the second battery 22 is connected to a positive voltage bus 24. The collector of transistor Q1 is coupled by a pair of series connected resistors 26 and 28 to the positive voltage bu 24.

When the output of the AND gate 16 is high, transistor Q1 turns on reducing the voltage potential at the intermediate node 27 between resistors 26 and 28. This lower voltage, which is applied to the base of transistor Q2, turns on transistor Q2 thereby coupling one end of a voltage divider, consisting of resistors 30 and 32, to the positive voltage bus 24. In this state, approximately 15 volts is applied across this voltage divider to produce an intermediate voltage of approximately +10 volts at a second node 34 between resistors 30 and 32.

The second node 34 is coupled to the bases of a pair of complementary conductivity type transistors Q4 and Q connected as an emitter follower between circuit ground 20 and the positive voltage bus 24. Specifically, the emitters of the complementary transistors Q4 and Q5 are connected together and their collectors are connected to the positive voltage bus 24 and circuit ground 20, respectively. The magnitude of the voltage appearing at the emitters of transistors Q4 and Q5 corresponds to the magnitude of the voltage applied to their base electrodes which are coupled to node 34.

The emitters of transistors Q4 and Q5 are coupled by resistor 36 to the gate electrode of the IGBT 13. Thus, when the voltage at node 34 is approximately +10 volts, the gate of the IGBT will be driven at about +9.4 volts, which is sufficient to enable the IGBT 13 to conduct several hundred amperes to the load 10. Under normal load conditions, the IGBT 13 will saturate soon after turning on so that the voltage across its collector and emitter $V_{ce}$ will drop to its saturation voltage (approximately 3–5 volts for example) for the applied gate potential. In addition, the potential at the first node 38, between the collector of the IGBT 13 and the load 10, will be equal to the voltage drop across the IGBT. Therefore, first node 38 will be less than the +15 volt level of the positive voltage bus 24.

In this state, the emitter of transistor Q3, which is coupled across resistor 30, is pulled up to approximately +15 volts by transistor Q2. As a result, a current flows through transistor Q2, the emitter-base junction of transistor Q3, resistor 40 and diode 42 to node 38. This current flow causes transistor Q3 to turn on providing a shunt current path around resistor 30, raising the potential at the second node 34 to about +15 volts. This increase in the voltage at the second node 34 raises the potential of the bases of the emitter follower transistors Q4 and Q5, thereby increasing the IGBT gate drive voltage to approximately +14.4 volts. The higher gate drive voltage increases the conductivity of the IGBT 10 and correspondingly decreases its saturation voltage $V_{ce}$. The decrease in the saturation voltage of the IGBT decreases the power loss in the device as well as allowing a higher current to flow to the load 10.

Should a short circuit occur across the load 10, the potential at the first node 38 will be substantially equal to the voltage of the first battery 12 (e.g. 550 volts) and significantly higher than the positive voltage bus 24. In this situation, the IGBT 10 will not saturate when it is turned on. As a result of the potential at the first node 38 being above the positive voltage bus potential, transistor Q3 will not turn on. Therefore, in a short circuit condition, resistor 30 will not be shunted and the potential at the bases of the emitter-follower transistors Q4 and Q5 will remain at their initial bias of approximately +9.4 volts. Consequently, the gate drive voltage and the conductivity of the IGBT 10 will also remain at their initial low levels. If a short circuit occurs after the IGBT 10 has fully turned on, transistor Q3 will be turned off thereby reducing the gate drive voltage and the conductivity of the IGBT.

As noted above, the time interval during which the IGBT 10 can carry a short circuit current, increases as the gate drive voltage decreases. Therefore, in the short circuit condition, the gate drive voltage is reduced enabling the IGBT to withstand the short circuit current for a longer period of time than when it is driven to a higher conductivity level. The precise value of the gate drive voltage in the short circuit condition is chosen so that the IGBT 10 will be able to withstand the short circuit current for a long enough interval for the current sensor 11 to act. When the current sensor detects a short circuit current, it applies a low logic level to line 15 which forces the output of AND gate 16 low. The low level from the AND gate turns off transistor Q1, which results in the IGBT 13 also turning off.

I claim:

1. A circuit for controlling the application of electricity to a load comprising:

an insulated gate bipolar transistor having a gate, an emitter and a collector with the emitter-collector conduction path coupling the load to a source of electricity;

means for sensing the voltage across the collector and emitter of said transistor;

means for driving the gate of said transistor at a first voltage level in response to said means for sensing indicating that the voltage across the collector and emitter is below a given threshold level, or at a second voltage level in response to said means for sensing indicating that the voltage across the collector and emitter is above the given threshold, the first voltage level producing a greater emitter-collector conductivity than the conductivity produced by the second voltage level; wherein said means for driving comprises a voltage divider formed by a pair of resistors connected in series by an intermediate node with the voltage at the intermediate node determining a voltage level at the gate of the insulated gate bipolar transistor.

2. The circuit as recited in claim 1 wherein said means for driving further comprises a switch means connected across one of said resistors to form a shunt current path when the voltage across the collector and emitter of the insulated gate bipolar transistor is [above] *below* the given threshold.

3. The circuit as recited in claim 1 wherein said means for driving further comprises:

a pair of complementary conductivity type transistors with each transistor having a base, a collector and an emitter, the bases of the pair of transistors being connected to the intermediate node, the emitters of the pair of transistors being connected together and coupled to the gate of the insulated gate bipolar transistor, and the collectors of the pair of transistors being coupled to a voltage source; and means for altering the voltage divider, in response to said means for sensing the voltage, to vary the voltage at the intermediate node.

4. A circuit for driving an insulated gate bipolar transistor having a gate, an emitter and a collector with the emitter-collector conduction path coupling a load to a source of electricity, the circuit comprising:

means for detecting whether the insulated gate bipolar transistor is in a state of saturation;

means, responsive to said means for detecting, for driving the insulated gate bipolar transistor to a first predefined conductivity level when the insulated gate bipolar transistor is in a state of saturation, or to a second predefined conductivity level when the insulated gate bipolar transistor is not in a state of saturation, the first conductivity level being greater than the second conductivity level; wherein said means for driving comprises a voltage divider connected across a voltage potential and having an intermediate node with the voltage at the intermediate node determining a voltage level at the gate of the insulated gate bipolar transistor.

5. The circuit as recited in claim 4 wherein said voltage divider comprises pair of resistors connected in series across the voltage potential with the intermediate node formed between said resistors.

6. The circuit as recited in claim 5 wherein said means for driving further comprises a switch means connected across one of said resistors to form a shunt current path when the voltage across the collector and emitter of the insulated gate bipolar transistor is *f*above the] *below a* given threshold.

7. The circuit as recited in claim 4 wherein said means for driving comprises:

a pair of complementary conductivity type transistors with each transistor having a base, a collector and an emitter, the bases of the pair of transistors being connected to the intermediate node, the emitters of the pair of transistors being connected together and coupled to the gate of the insulated gate bipolar transistor, and the collectors of the pair of transistors being coupled to a voltage source; and means for altering the voltage divider, in response to said means for detecting to vary the voltage at the intermediate node.

8. A circuit for driving an insulated gate bipolar transistor having a gate, an emitter and a collector with the emitter-collector conduction path coupling a load to a source of electricity, the circuit comprising:

a source of a voltage potential;

first and second resistors connected in series at an common node;

means for selectively coupling said series connected first and second resistors to said source of a voltage potential;

a pair of complementary conductivity type transistors with each transistor having a base, a collector and an emitter, the bases of the pair of transistors being connected to the common node, the emitters of the pair of transistors being connected together and coupled to the gate of the insulated gate bipolar transistor, and the collectors of the pair of transistors being coupled to a voltage source potential;

a shunt transistor having an emitter-collector conduction path connected across one of the first and second resistors, and having a base electrode; and means for biasing the base of said shunt transistor in response to the voltage across the collector and emitter of the insulated gate bipolar transistor.

9. The circuit as recited in claim 8 wherein said means for biasing the base of said shunt transistor comprises a diode and a resistor connected in series between the base of the shunt transistor and the collector of the insulated gate bipolar transistor.

*10. A circuit for controlling the application of electricity to a load comprising:*

*an insulated gate bipolar transistor having a gate, an emitter and a collector with the emitter-collector conduction path coupling the load to a source of electricity, thereby forming a first node between the load and said insulated gate bipolar transistor;*

*means, responsive to a voltage level at a control terminal which is indicative of the the voltage across the collector and emitter, for selectively driving said insulated gate bipolar transistor into a first conductive state when the voltage across the collector and emitter is below a threshold level, or into a second conductive state when the voltage across the collector and emitter is above the threshold level, said insulated gate bipolar transistor being less conductive in the second conductive state than in the first conductive state; and*

*a diode coupled between the first node and the control terminal.*

*11. The circuit as recited in claim 10 wherein said diode is coupled to become reverse biased when said insulated gate bipolar transistor is in a non-conductive state.*

*12. The circuit as recited in claim 10 wherein said diode is coupled to become reverse biased when the voltage across the collector and emitter is above the threshold level, and to become forward biased when the voltage across the collector and emitter is below the threshold level.*

*13. The circuit as recited in claim 10 wherein said means for selectively driving comprises:*

*a voltage divider including a pair of resistors connected in series forming a second node between the resistors, a voltage level at the second node controlling the conductive state of said insulated gate bipolar transistor; and*

*a switch means, connected across one of said resistors, for providing a shunt current path when the voltage across the collector and emitter of the insulated gate bipolar transistor is below the given threshold.*

*14. The circuit as recited in claim 13 wherein:*

*said switch means is another transistor having a base, and a second emitter-collector path connected in parallel with the one resistor; and*

*said diode is coupled to the base so that said diode becomes reverse biased when the voltage across the collector and emitter of the insulated gate bipolar transistor is above the threshold level, and becomes forward biased when the voltage across the collector and emitter of the insulated gate bipolar transistor is below the threshold.*

* * * * *

UNITED STATES PATENT AND TRADEMARK OFFICE

CERTIFICATE OF CORRECTION

PATENT NO. : RE. 34,107

DATED : October 20, 1992

INVENTOR(S) : William F. Wirth

It is certified that error appears in the above-identified patent and that said Letters Patent is hereby corrected as shown below:

In column 5, line 22 (claim 6), change "*f*above" to --[above--.

Signed and Sealed this

Twelfth Day of October, 1993

*Attest:*

Bruce Lehman

BRUCE LEHMAN

*Attesting Officer*

*Commissioner of Patents and Trademarks*